US011525590B2

(12) United States Patent
Chen et al.

(10) Patent No.: US 11,525,590 B2
(45) Date of Patent: Dec. 13, 2022

(54) BEZEL WITH AIR FILTRATION AND CABLE MANAGEMENT FOR AN INFORMATION HANDLING SYSTEM

(71) Applicant: DELL PRODUCTS, LP, Round Rock, TX (US)

(72) Inventors: Julian Yu-Hao Chen, Austin, TX (US); Chin-An Huang, Zhonghe District (TW); Peter Clark, Zhongzheng District (TW); Amrita Sidhu Maguire, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 67 days.

(21) Appl. No.: 17/164,267

(22) Filed: Feb. 1, 2021

(65) Prior Publication Data
US 2022/0243935 A1    Aug. 4, 2022

(51) Int. Cl.
H05K 7/14   (2006.01)
F24F 8/108  (2021.01)
H05K 7/20   (2006.01)

(52) U.S. Cl.
CPC ............ *F24F 8/108* (2021.01); *H05K 7/1489* (2013.01); *H05K 7/20145* (2013.01); *H05K 7/20736* (2013.01)

(58) Field of Classification Search
CPC ............ G06F 1/20; G06F 1/181; G06F 1/187; H05K 7/20736; H05K 7/20145; H05K 7/2049; H05K 7/1487; H05K 5/0004; H05K 7/1405; H05K 5/0221; H05K 5/0239; H05K 5/0204; H05K 5/00

USPC ......... 361/690, 724, 727, 725, 679.58, 692, 361/752, 732, 679.02, 801, 759
See application file for complete search history.

(56) References Cited

U.S. PATENT DOCUMENTS

| 7,075,511 B1 * | 7/2006 | Mousseau ................. B60R 1/12 |
| | | 359/838 |
| 9,575,517 B1 * | 2/2017 | Egan ........................ G07G 1/12 |
| 10,324,503 B1 * | 6/2019 | O'Donnell .............. G06F 1/182 |
| 2016/0209868 A1 | 7/2016 | Hailman et al. |
| 2019/0050030 A1 * | 2/2019 | Baum .................. H05K 7/1487 |
| 2020/0306678 A1 * | 10/2020 | Kanno .................. B01D 46/62 |
| 2022/0232719 A1 * | 7/2022 | Guzman ................. H05K 5/03 |

OTHER PUBLICATIONS

Quick Installation Guide for the SmartEdge 1200 Front Bezel 220-0884-R2A, www.rbman.ito.expert/en_tzn7830002_r6a/6_15330-CRA1191170_1UenA.html, Telefonaktiebolaget LM Ericsson; Nov. 30, 2020; 12 pages.

* cited by examiner

*Primary Examiner* — Mandeep S Buttar
(74) *Attorney, Agent, or Firm* — Larson Newman, LLP

(57) ABSTRACT

An information handling system includes a server and a bezel. The server includes multiple external ports and a mounting bracket. Multiple cables are connected to the external ports. The external ports are located within an air inlet surface of the server. The mounting bracket extends from the air inlet surface. The bezel includes a main frame and a filter. When the main frame is connected with the mounting bracket, the main frame covers the external ports and the cables. The cables extend through the cable router of the mounting bracket to exit an area between the main frame and the air inlet surface. The filter snap fits within the main frame, and provides air filtration to an airflow prior to the airflow being pulled into the server.

15 Claims, 8 Drawing Sheets

BEZEL WITH AIR FILTRATION AND CABLE MANAGEMENT FOR AN INFORMATION HANDLING SYSTEM

FIELD OF THE DISCLOSURE

The present disclosure generally relates to information handling systems, and more particularly relates to a bezel with air filtration and cable management for an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a server and a bezel. The server includes multiple external ports and a mounting bracket to connect the bezel to the server. Multiple cables may be connected to the external ports. The external ports are located within an air inlet surface of the server. The mounting bracket extends from the air inlet surface. The bezel includes a main frame and a filter. When the main frame is connected with the mounting bracket, the main frame covers the external ports and the cables. The cables extend through the cable router of the mounting bracket to exit an area between the main frame and the air inlet surface. The filter snap fits within the main frame, and may provide air filtration to an airflow prior to the airflow being pulled into the server.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
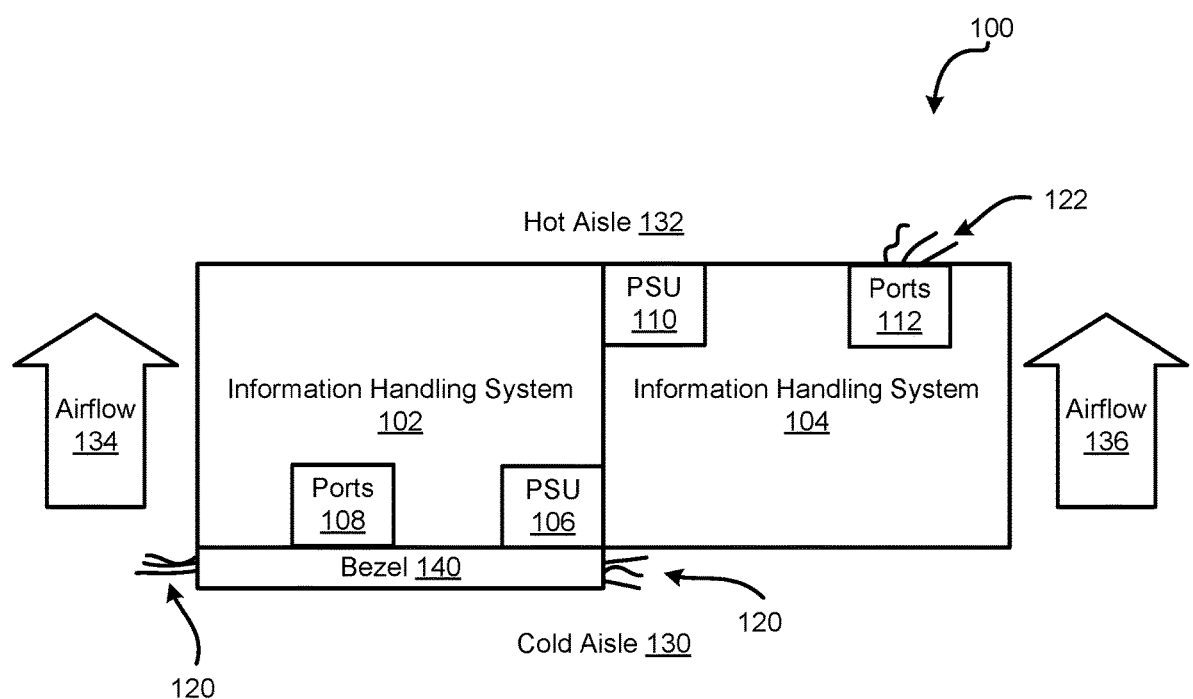
FIG. 1 is a block diagram of multiple information handling systems mounted in a server system according to at least one embodiment of the disclosure.

FIG. 1 shows an information handling system 100 including servers 102 and 104 according to at least one embodiment of the disclosure. For purpose of this disclosure an information handling systems can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

Server 102 includes a power supply unit 106 and external ports 108. Similarly, server 104 includes a power supply unit 110 and external ports 112. In server system 100, multiple server racks may be located next to one another and may hold any number of information handling systems, including servers 102 and 104. In an example, server 102 may utilize external ports 108 to communicate with other information handling systems via cables 120. Similarly, server 104 may utilize external ports 112 to communicate with other information handling systems via cables 122. Within each server rack multiple servers may be placed on top of one another. Servers 102 and 104 may include additional components over those illustrates in FIG. 1 without varying from the scope of this disclosure.

During operation, servers 102 and 104 may produce heat that needs to be dissipated to prevent over heating and shutdown. System 100 includes a cold aisle 130 that may provide cool or cold air to servers 102 and 104, and a hot aisle 132 that may receive hot exhaust air from the information handling systems. In an example, each of servers 102 and 104 may have its own airflow 134 or 136. For example, airflow 134 may travel from cold aisle 130 through server 102 to hot aisle 132. Similarly, airflow 136 may travel from cold aisle 130 through server 104 to hot aisle 132.

As illustrated in FIG. 1, server 104 is orientated in a traditional orientation, such that power supply unit 110 is located along hot aisle 132. Additionally, external ports 112 of server 104 may be located along hot aisle 132. Server 104 may include air filtration components, such as a filter, along cold aisle 130 to filter airflow 136 at an airflow inlet surface of the server.

As illustrated in FIG. 1, server 102 is orientated in a reverse orientation, such that power supply unit 106 and external ports 108 are located along cold aisle 130. In system 100, a user or individual may access servers 102 and 104 from cold aisle 130, such that cables 120 may be viewable and accessible by the user or individual. In this example, a bezel 140 may be attached to server 102 for any suitable reason including, to but not limited to, preventing unauthorized individuals from accessing cables 120, and providing decorative product branding. Server 102 may also need air filtration components at the inlet of airflow 134 within the server. In an example, bezel 140 may include a filter to provide the proper air filtration at the inlet of airflow 134 into server 102 from cold aisle 130. Thus, bezel 140 may cover and prevent access to cables 120, and may also provide air filtration at the inlet of airflow 134 into server 102.

Figure 2:
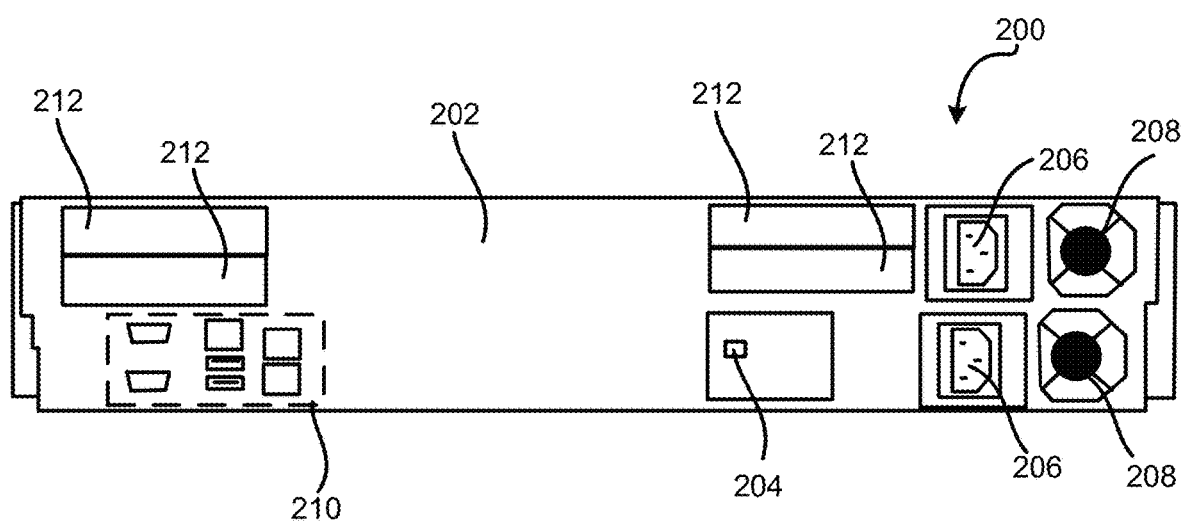
FIG. 2 is a block diagram of a rear panel of an information handling system according to at least one embodiment of the disclosure.

FIG. 2 illustrates an information handling system, such as a server 200, including a chassis having a front panel, side panels, and a rear panel 202 according to at least one embodiment of the disclosure. Server 200 may be any suitable information handling system including, but not limited to, server 102 of FIG. 1. Rear panel 202 may provide a user with access to one or more components of the server. Rear panel 202 includes a power button 204, multiple power supply units (PSUs) 206, multiple cooling fans 208, external ports 210, and one or more other components of server 200.

In an example, server 200 is orientated in a reverse orientation as compared with traditional orientations, such that PSUs 206 and external ports 210 within rear panel 202 are located along a cold aisle, such as cold aisle 130 of FIG. 1. In this example, cables from external ports 210 may be viewable by a user or individual. Based on external ports 210 and cables being viewable and accessible by an individual, a bezel may be attached to server 200 to cover the ports and provide cable routing management. Additionally, the bezel may provide any suitable requirements of air filtration for the airflow pulled into server 200 by cooling fans 208. In an example, the air filtration requirement may include, but is not limited to, a network equipment building systems (NEBS) air filtration requirement. An exemplary bezel 300 for server 200 is described with respect to FIG. 3 below.

Figure 3:
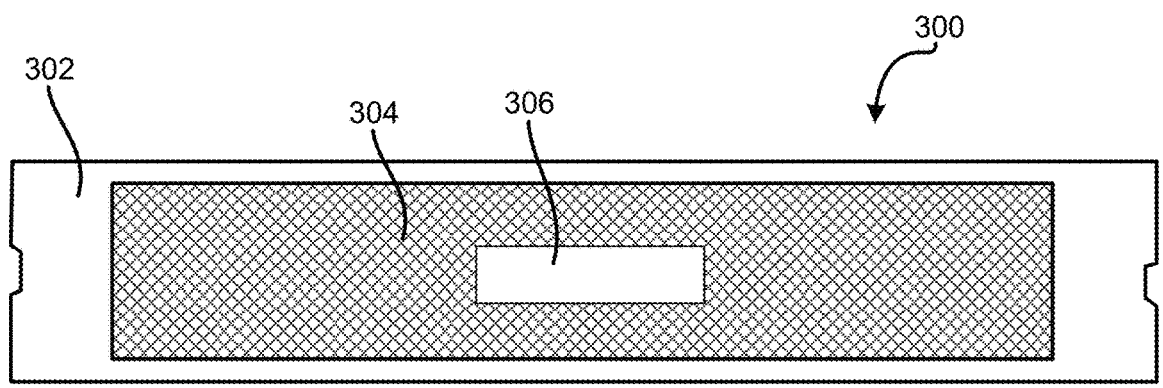
FIG. 3 is a block diagram of a bezel for an information handling system according to at least one embodiment of the present disclosure.

FIG. 3 illustrates bezel 300 for an information handling system, such as server 200 of FIG. 2, according to at least one embodiment of the present disclosure. Bezel 300 includes a main frame 302, a filter 304, and a branding badge 306. In an example, bezel 300 may be placed in physical communication with and connected to server 200 of FIG. 2 in any suitable manner. For example, bezel 300 may snap fit onto one or more tabs of server 200 of FIG. 2.

Bezel 300 may provide airflow filtration for server 200 of FIG. 2. For example, upon bezel 300 being placed in physical communication with server 200 of FIG. 2, an airflow may be pulled through filter 304 and into the server. In this example, filter 304 may provide proper filtration for the airflow prior to the airflow entering server 200 of FIG. 2. In an example, branding badge 306 may include any suitable branding information including, but not limited to, a company logo and a company name.

Figure 4:
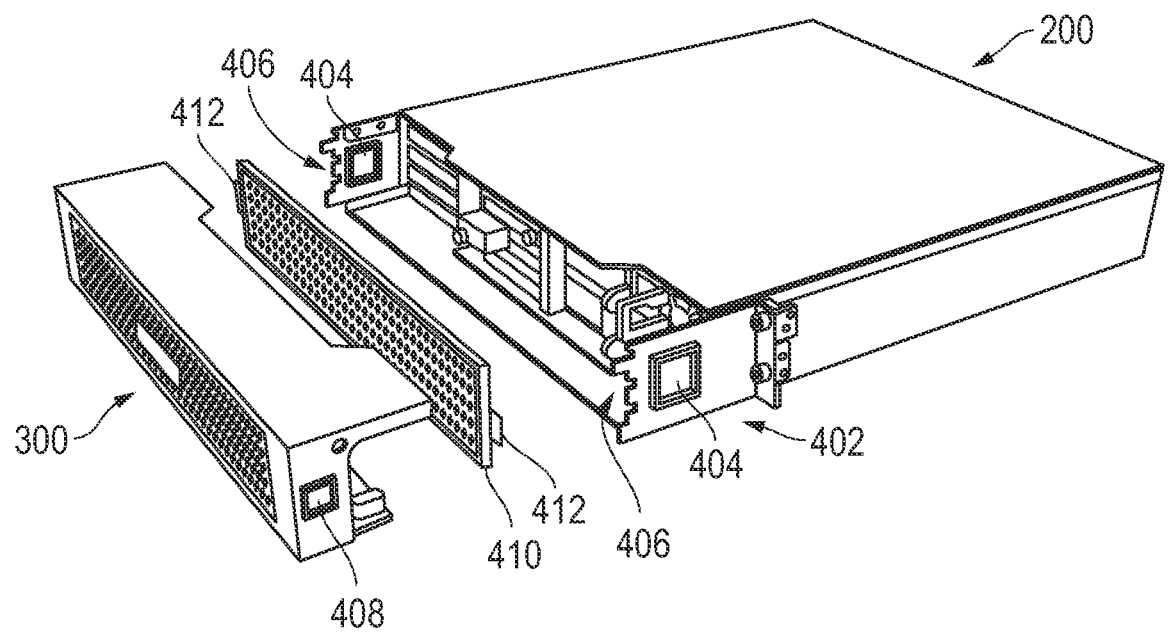
FIG. 4 is a perspective view of a cable management routing according to at least one embodiment of the present disclosure.

FIG. 4 illustrates server 200, bezel 300, and a filter 410 according to at least one embodiment of the present disclosure. Server 200 includes cable routing and mounting bracket 402, which in turn includes multiple cable routers 404 and multiple mounting tabs 406. Bezel 300 includes multiple mounting inserts 408. Filter 410 includes multiple release tabs 412. In an example, filter 410 may be any suitable filter including, but not limited to, filter 304 of FIG. 3.

In an example, cable routing and mounting bracket 402 may be securely mounted to the side surfaces and to a bottom surface of server 200. Cable routing and mounting bracket 402 may extend away from server 200 in a direction perpendicular to a back surface of the server. In certain examples, the back surface may refer to the surface of server 200 in which PSUs 206, cooling fans 208, and external ports of FIG. 2 are located. However, the back surface may be accessible from either a cold aisle or a hot aisle of a server system, such as cold aisle 130 or hot aisle 132 of server system 100 of FIG. 1. As illustrated in FIG. 1, the back surface of server 102 is facing cold aisle 130, such that the back surface of substantially similar server 200 may face a cold aisle.

Cable routing and mounting bracket 402 may include any suitable number of cable routers 404. For example, cable routing and mounting bracket 402 may include two cable routers 404. In an example, each cable router 404 may be located on a different end of cable routing and mounting bracket 402. Each cable router 404 may be any suitable component including, but not limited to, an adjustable component to enable one or cables to exit an area between server 200 and bezel 300. In an example, cable router 404 may include one or more items to enable the cables to exit while blocking airflow from exiting the area between server 200 and bezel 300. For example, each cable router 404 may include brushes to provide an adjustable area for the cables to exit the area between server 200 and bezel 300. The brushes of cable router 404 may also prevent airflow from bezel 300 to server 200 from escaping through each cable router 404. In an example, the brushes may be small and tightly spaced enough so that the brushes may minimize a number and size of openings within cable routers 404.

In certain examples, bezel 300 may utilize mounting inserts 408 to connect the bezel to server 200. In an example, mounting tabs 406 of mounting bracket 402 may interface with mounting inserts 408 in any suitable manner to hold bezel 300 in physical communication with server 200. For example, each mounting tab 406 may be inserted and snap fitted within a corresponding mounting insert 408, and the snap fit of the tab into the insert may hold the bezel in physical communication with the server. Bezel 300 may be removed from server 200 via a reverse manner as described without respect to attaching the bezel to the server. For example, mounting tabs 406 may be pulled or otherwise disengaged from mounting inserts 408 so that bezel 300 may no longer be in physical communication with server 200. In an example, attachment and removal of bezel 300 to server 200 may be a toolless, such that an individual may be able to remove bezel 300 to access cables and to replace or change filter 410.

In an example, filter 410 may be mounted within bezel 300 without tools. For example, tabs 412 of filter 410 may snap fit within mounting inserts 408 of bezel 300. In this example, the toolless mounting of filter 410 may ease the actions of an individual when replacing the filter. Filter 410 may be easily replaced by a user pulling release tabs 412 from mounting inserts 408. In response to a current filter being removed, a user may connect another filter 410 by snap fitting the new filter within bezel 300.

Figure 5:
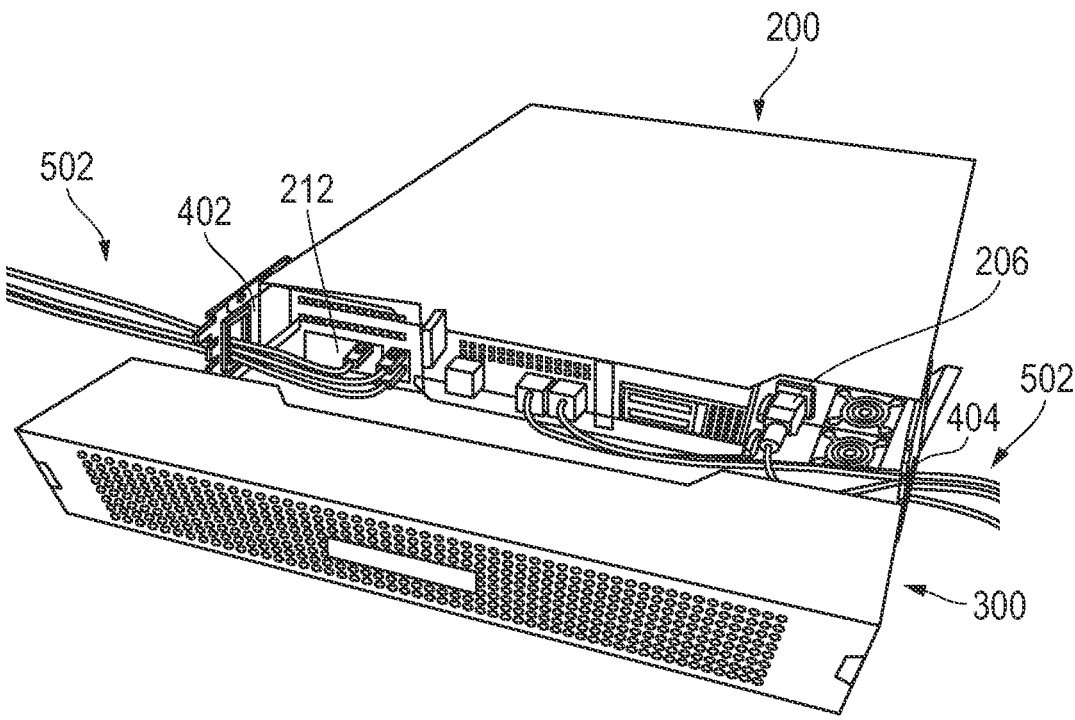
FIG. 5 is a perspective view of a bezel, a filter, and an information handling system according to at least one embodiment of the present disclosure.

FIG. 5 illustrates cable management routing of cables 502 from an area between server 200 and bezel 300 according to at least one embodiment of the present disclosure. In an example, cables 502 may connect to external ports 212 and PSUs 206 of server 200. In certain examples, cables 502 may be any suitable size or type including, but not limited to, power cords, HDMI cables, ethernet cables, and video cables.

Any number of cables 502 may be inserted through a particular cable router 404 to interface with external ports 212, PSUs 206, or the like. In an example, an individual may insert a subset of cables 502 associated with external ports 212 through cable router 404 on one side surface of server 200 and may insert another subset of cables 502 associated with PSUs 206 and HDMI ports through cable router 404 on the opposite side surface. Upon cables 502 being inserted through cable routers 404 and connected with external ports 212, PSUs 206, or the like, bezel 300 may be attached to and closed on server 200 as shown in FIG. 6.

Figure 6:
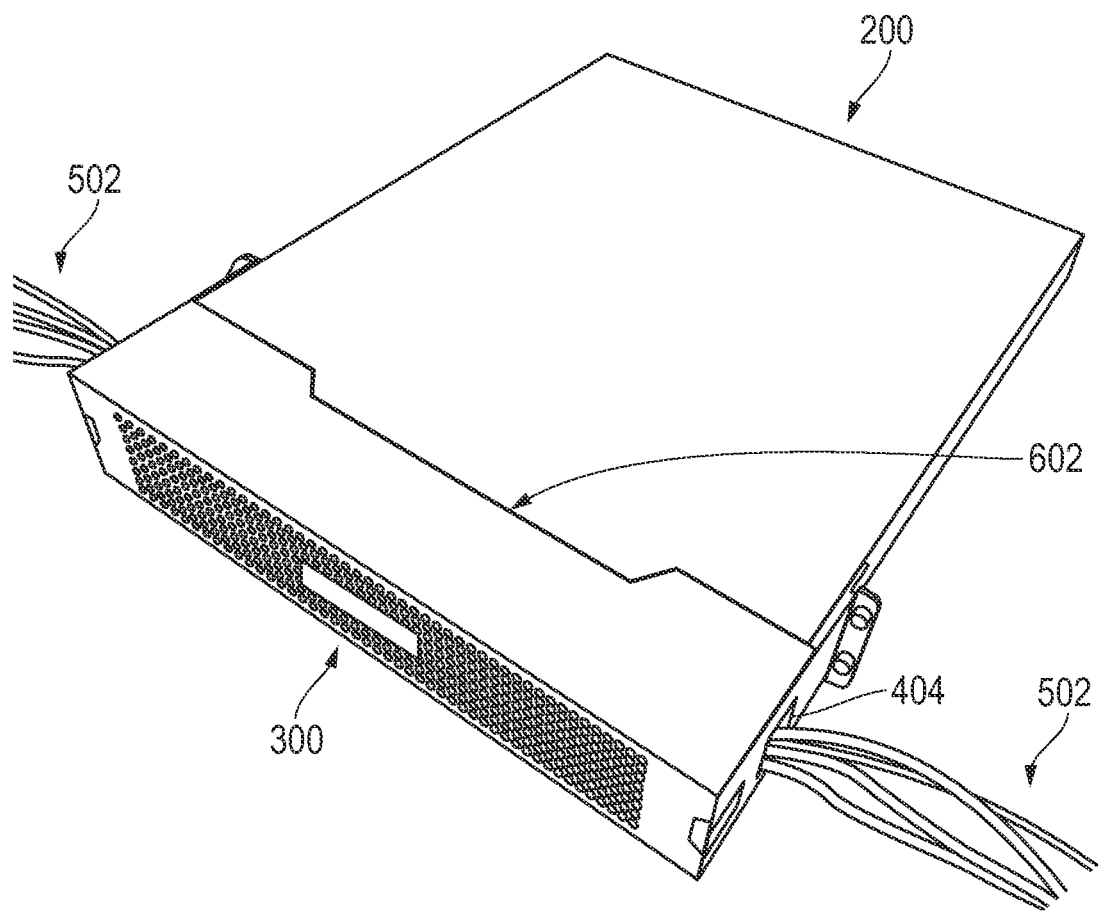
FIG. 6 is a perspective view of an embodiment of a cable routing between a bezel and an information handling system according to at least one embodiment of the present disclosure.

FIG. 6 illustrates cable routing while bezel 300 is in physical communication with server 200 according to at least one embodiment of the present disclosure. Bezel 300 may be connected to server 200 in any suitable manner. When bezel 300 is placed in physical communication with server 200 based on mounting insert 408 snap fitting on a mounting bracket, such as mounting bracket 402 of FIG. 4, a seal 602 may be formed along the physical interface between the bezel and the server. In certain examples, bezel 300 may include any suitable material, such as a rubber gasket, to create seal 602. Seal 602 may also be created via physical communication between bezel 300 and server 200.

In an example, airflow may be pulled in through bezel 300 toward server 200. In this example, seal 602 and brushes within cable router 404 may prevent the airflow from escaping from the area between bezel 300 and server 200. The brushes within cable router 404 enable cables 502 to extend from the area between bezel 300 and server 200 while closing any gaps between the cables and the cable router.

Figure 7:
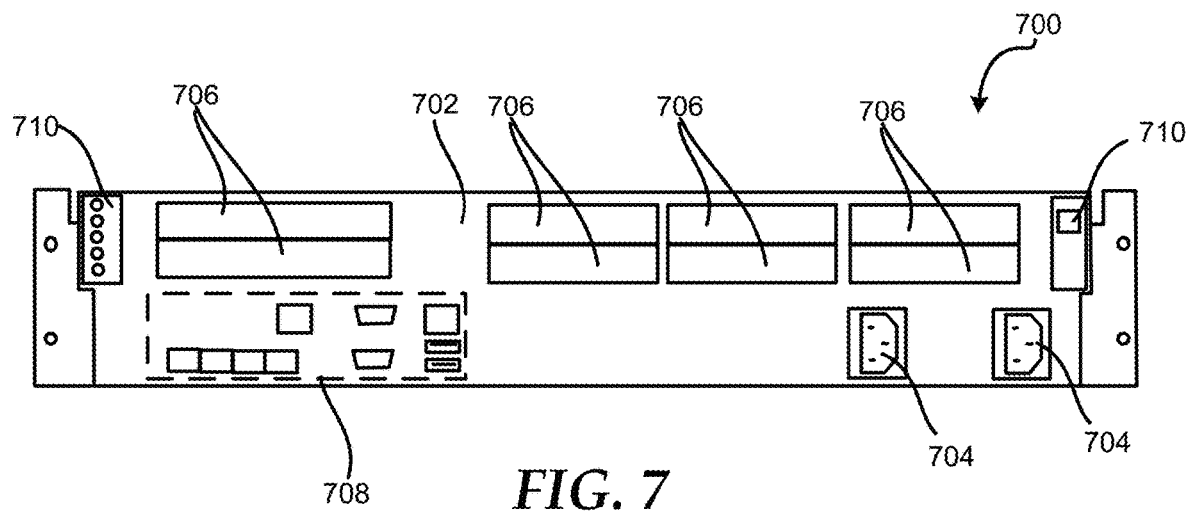
FIG. 7 is a block diagram of a rear panel of another information handling system according to at least one embodiment of the disclosure.

FIG. 7 illustrates an information handling system, such as a server 700, including a chassis having a front panel, side panels, and a rear panel 702 according to at least one embodiment of the disclosure. Server 700 may be any suitable information handling system including, but not limited to, server 102 of FIG. 1. Rear panel 702 may provide a user with access to one or more components of the server. Rear panel 702 includes multiple PSUs 704, multiple components 706, multiple cooling fans, external ports 708, status indicator light emitting diodes (LEDs) 710 and 712, and one or more other components of server 700.

In an example, server 700 is orientated in a reverse orientation as compared with traditional orientations, such that PSUs 704 and external ports 708 are located along a cold aisle, such as cold aisle 130 of FIG. 1. In this example, cables from external ports 708 may be viewable by a user or individual. Based on external ports 708 and cables being viewable and accessible by an individual, a bezel may be attached to server 700 cover the ports and provide cable routing management.

Status indicator LEDs 710 may provide visible indicators for any suitable health status of server 700, and these status indicator LEDs can be visibly shown through transparent windows in the filter bezel. In an example, each of status indicator LEDs 710 may be associated with a different component of server 700. For example, one of the status indicator LED 710 may be associated with an overall health of server 700, another status indicator LED may be associated with an AC power health, another status indicator LED may be associated with thermal conditions of the server, another status indicator LED may be associated with PCIe devices, and another status indicator LED may be associated with DIMMs of the server. In an example, status indicator LEDs 710 may provide different colors based on the status, such as green for good conditions, amber for medium conditions, red for bad conditions, or the like. Additionally, the bezel may provide any suitable requirements of air filtration for the airflow pulled into server 700 by cooling fans. In an example, the air filtration requirement may include, but is not limited to, a NEBS air filtration requirement. An exemplary bezel 800 for server 700 is described with respect to FIG. 8 below.

Figure 8:
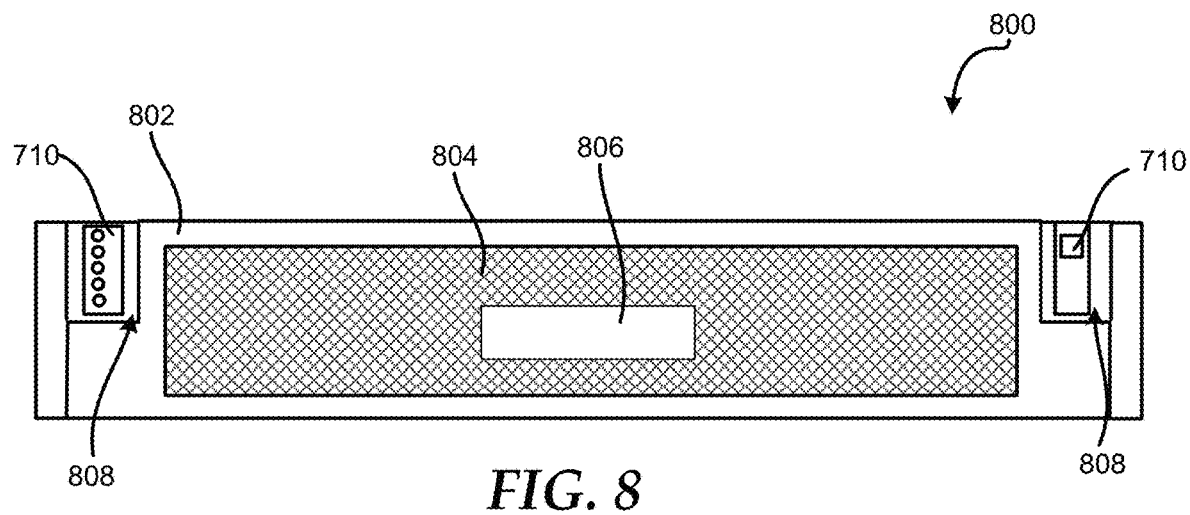
FIG. 8 is a block diagram of another bezel for an information handling system according to at least one embodiment of the present disclosure.

FIG. 8 illustrates a bezel 800 for an information handling system, such as server 700 of FIG. 7, according to at least one embodiment of the present disclosure. Bezel 800 includes a main frame 802, a filter 804, a branding badge 806, and multiple display notches 808. In an example, bezel 800 may be placed in physical communication with and connected to server 700 of FIG. 7 in any suitable manner. For example, bezel 800 may snap fit onto one or more tabs of server 700 of FIG. 7.

Bezel 800 may provide airflow filtration for server 700 of FIG. 2. For example, when bezel 800 is placed in physical communication with server 700 of FIG. 7, an airflow may be pulled through filter 804 and into the server. In this example, filter 804 may provide proper filtration for the airflow prior to the airflow entering server 700 of FIG. 7. In an example, branding badge 806 may include any suitable branding information including, but not limited to, a company logo and a company name. Notches 808 may be in particular locations to enable status indicator LEDs 710 and 712 to be visible while bezel 800 is attached to server 700. As illustrated in FIG. 8, notches 808 may be rectangular recesses in opposite corners of main frame 802. While notches 808 are described as being rectangular recesses in main frame 802, the notches may be any suitable shape or size without varying from the scope of this disclosure.

In an example, filter 804 may be mounted within bezel 800 without tools in substantially the same manner as filter 410 is attached to bezel 300 as described in FIG. 4. For example, filter 804 includes one or more tabs to snap fit within mounting inserts of bezel 800. In this example, the toolless mounting of filter 804 may provide ease when replacing the filter. Filter 804 may be easily replaced by a user unsnapping the tabs from bezel 800. In response to a current filter being removed, a user may connect another filter 804 by snap fitting the new filter within bezel 800.

Figure 9:
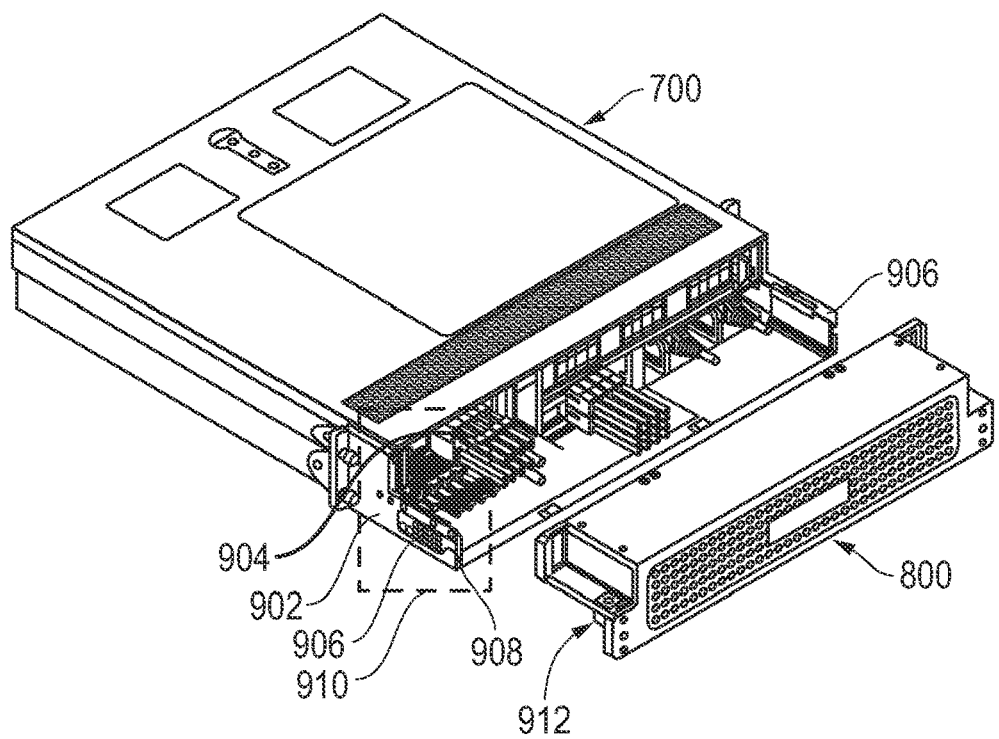
FIGS. 9 and 10 are different perspective views of cable management in an information handling system according to at least one embodiment of the present disclosure.
Figure 10:
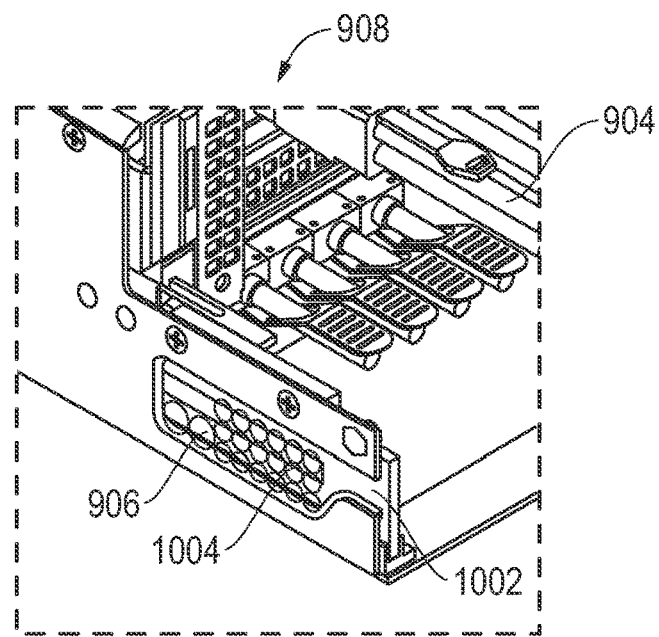

FIGS. 9 and 10 illustrate cable management between server 700 and bezel 800 according to at least one embodiment of the present disclosure. Server 700 includes a mounting bracket 902 which in turn may be secured to one or more surfaces of the server. For example, mounting bracket 902 may be securely connected to the side surfaces, and a bottom surface of server 700. In an example, cables 904 may connect to external ports and PSUs of server 900. In certain examples, cables 904 may be any suitable size or type including, but not limited to, power cords, HDMI cables, Ethernet cables, and video cables. Mounting bracket 902 includes cable routers 906 and one or more mounting tabs 908.

Any number of cables 904 may be inserted through a particular cable router 906 to interface with external ports, PSUs, or the like. In an example, an individual may insert a subset of cables 904 associated with external ports through cable router 906 on one side surface of server 700 and may insert another subset of cables 904 associated with PSUs and HDMI ports through cable router 906 on the opposite side surface. Upon cables 904 being inserted through cable routers 906 and connected with external ports, PSUs, or the like, bezel 800 may be attached to and closed on server 700. Cable router 906 will be described in greater detail with respect to FIG. 10, which illustrates a portion 910 of mounting bracket 902.

Referring now to FIG. 10, portion 910 of server 700 includes a cable router 906, which in turn includes a slot 1002 and brushes 1004. In an example, cables 904 may be inserted into cable router 906 via slot 1002. In this example, brushes 1004 may separate to enable one or more cables 904 to be inserted into cable router 906 via slot 1002. Brushes 1004 may provide an adjustable area for cables 904 to exit an area between server 700 and bezel 800. Brushes 1004 of cable router 906 may also prevent airflow from bezel 800 to server 700 from escaping through each cable router 906. In an example, brushes 1004 may be small enough and tightly spaced so that the brushes may minimize a number and size of openings within cable routers 906.

Referring back to FIG. 9, bezel 800 includes one or more mounting inserts 912. In an example, mounting insert 912 of bezel 800 may mate in any suitable manner with mounting tab 908 of mounting back 902. For example, as bezel 800 is pushed toward mounting back 902 of server 700, mounting tab 908 of the mounting bracket may interface with mounting insert 912 of the bezel until the two connectors are fully mated together. In an example, mounting tab 908 and mounting insert 912 may be mated together in response to mounting insert 912 snap fitting over mounting tab 908, which in turn may hold bezel 800 in physical communication with server 700. Bezel 800 may be removed from server 700 via a reverse manner as described without respect to attaching the bezel to the server. For example, mounting insert 912 may be pulled or otherwise disengaged from mounting tab 908 so that bezel 800 may no longer be in physical communication with server 700. In an example, attachment and removal of bezel 800 to server 700 may be a toolless attachment and removal, such that an individual may be able to remove bezel 800 to access cables and to replace or change filter 804 of FIG. 8. While mating of mounting tab 908 and mounting insert 912 has been described with respect to a single mounting tab 908 and a single mounting insert 912, one of ordinary skill in the art would recognize that any suitable number of mounting tabs may be included within server 700 and any suitable number of mounting inserts may be included within bezel 800 without varying from the scope of this disclosure.

Figure 11:
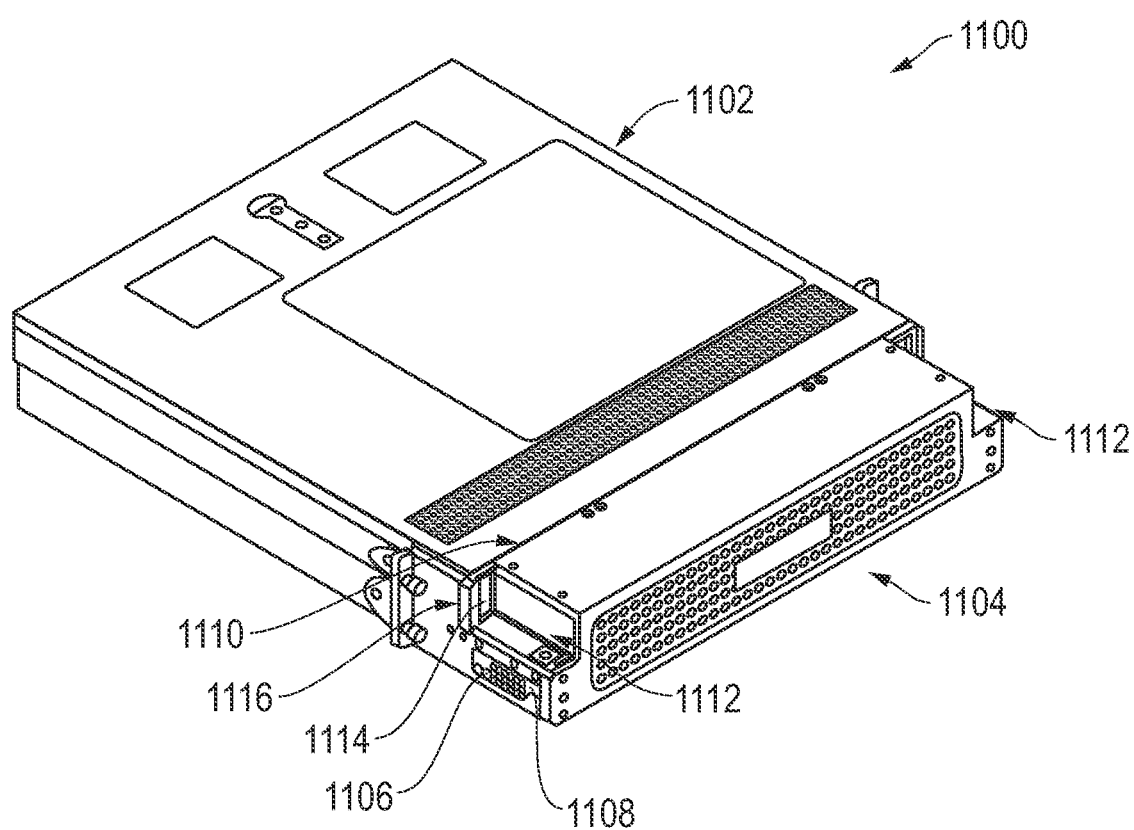
FIG. 11 is a perspective view of another embodiment of a cable routing between a bezel and an information handling system according to at least one embodiment of the present disclosure.

FIG. 11 illustrates an information handling system 1100 including a server 1102 and a bezel 1104 according to at least one embodiment of the present disclosure. Server 1102 includes multiple cable routers 1106, which in turn each cable router includes brushes 1108. In an example, server 1102 may be any suitable device including, but not limited to server 102 of FIG. 1 and server 700 of FIG. 7. Bezel 1104 may be substantially similar to bezel 800 of FIG. 8. When bezel 1104 is placed in physical communication with server 1102, a mounting insert of the bezel may snap fit onto a connector of the server to secure the bezel to the server. In an example, mating of the two connectors may be substantially similar to the mating of mounting tab 908 and mounting insert 912 as described above with respect to FIG. 9. Based on bezel 1104 being securely mounted on server 1102, a seal 1110 may be formed along the physical interface between the bezel and the server.

In an example, airflow may be pulled in through bezel 1104 toward server 1102. In this example, seal 1110 and brushes 1108 within cable routers 1106 may prevent the airflow from escaping from the area between bezel 1104 and server 1106. Brushes 1108 within cable routers 1106 may enable cables to extend from the area between bezel 1104 and server 1102 while closing any gaps between the cables. Notches 1112 in bezel 1104 may enable health indicator LEDs 1114 of server 1102 to be visible when the bezel is attached to the server. As shown in FIG. 11, notches 1112 may include a frame 1116 to be placed in physical communication with server 1102 while enabling health indicator LEDs 1114 to be visible.

Figure 12:
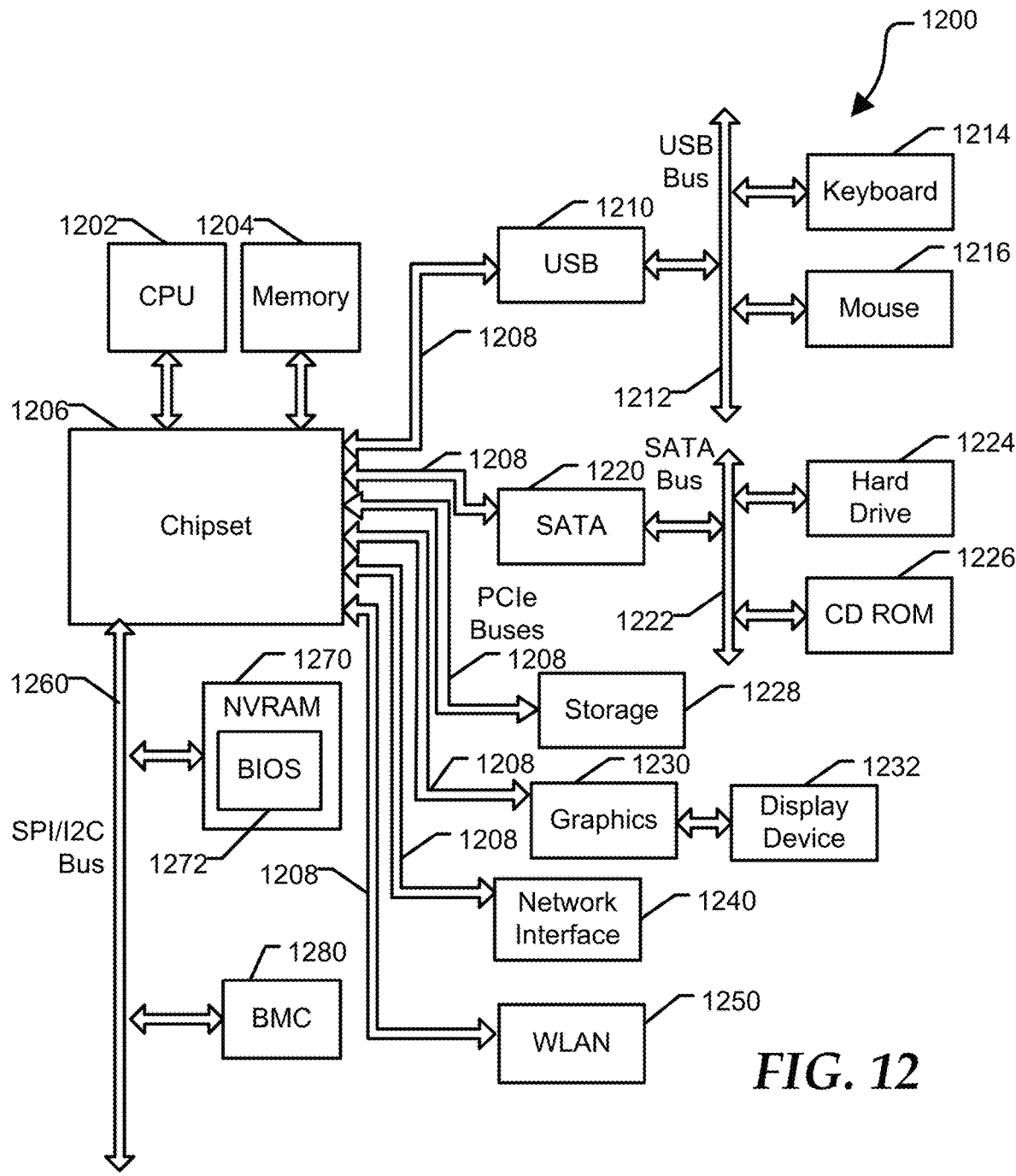
FIG. 12 is a block diagram of a general information handling system according to at least one embodiment of the present disclosure.

FIG. 12 illustrates a general information handling system 1200. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 1200 including a processor 1202, a memory 1204, a chipset 1206, one or more PCIe buses 1208, a universal serial bus (USB) controller 1210, a USB bus 1212, a keyboard device controller 1214, a mouse device controller 1216, a configuration a SATA bus controller 1220, a SATA bus 1222, a hard drive device controller 1224, a compact disk read only memory (CD ROM) device controller 1226, a storage 1228, a graphics device controller 1230, a network interface controller (NIC) 1240, a wireless local area network (WLAN) or wireless wide area network (WWAN) controller 1250, a serial peripheral interface (SPI) bus 1260, a NVRAM 1270 for storing BIOS 1272, and a baseboard management controller (BMC) 1280. In an example, chipset 1206 may be directly connected to an individual end point via a PCIe root port within the chipset and a point-to-point topology as shown in FIG. 12. BMC 1280 can be referred to as a service processor or embedded controller (EC). Capabilities and functions provided by BMC 1280 can vary considerably based on the type of information handling system. For example, the term baseboard management system is often used to describe an embedded processor included at a server, while an embedded controller is more likely to be found in a consumer-level device. As disclosed herein, BMC 1280 represents a processing device different from CPU 1202, which provides various management functions for information handling system 1200. For example, an embedded controller may be responsible for power management, cooling management, and the like. An embedded controller included at a data storage system can be referred to as a storage enclosure processor.

System 1200 can include additional processors that are configured to provide localized or specific control functions, such as a battery management controller. Bus 1260 can include one or more busses, including a SPI bus, an I2C bus, a system management bus (SMBUS), a power management bus (PMBUS), and the like. BMC 1280 can be configured to provide out-of-band access to devices at information handling system 1200. As used herein, out-of-band access herein refers to operations performed prior to execution of BIOS 1272 by processor 1202 to initialize operation of system 1200.

BIOS 1272 can be referred to as a firmware image, and the term BIOS is herein used interchangeably with the term firmware image, or simply firmware. BIOS 1272 includes instructions executable by CPU 1202 to initialize and test the hardware components of system 1200, and to load a boot loader or an operating system (OS) from a mass storage device. BIOS 1272 additionally provides an abstraction layer for the hardware, such as a consistent way for application programs and operating systems to interact with the keyboard, display, and other input/output devices. When power is first applied to information handling system 1200, the system begins a sequence of initialization procedures. During the initialization sequence, also referred to as a boot sequence, components of system 1200 are configured and enabled for operation, and device drivers can be installed. Device drivers provide an interface through which other components of the system 1200 can communicate with a corresponding device.

Information handling system 1200 can include additional components and additional busses, not shown for clarity. For example, system 1200 can include multiple processor cores, audio devices, and the like. While a particular arrangement of bus technologies and interconnections is illustrated for the purpose of example, one of skill will appreciate that the techniques disclosed herein are applicable to other system architectures. System 1200 can include multiple CPUs and redundant bus controllers. One or more components can be integrated together. For example, portions of chipset 1206 can be integrated within CPU 1202. Additional components of information handling system 1200 can include one or more storage devices that can store machine-executable code, one or more communications ports for communicating with external devices, and various input and output (I/O) devices, such as a keyboard, a mouse, and a video display. An example of information handling system 1200 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

In an example, information handling system 1200 may be any suitable device including, but not limited to, information handling system 200 of FIG. 2, information handling system 700 of FIG. 7, and server 1102 of FIG. 11. Information handling system 1200 can include a set of instructions that can be executed to cause the information handling system to perform any one or more of the methods or computer based functions disclosed herein. The information handling system 1200 may operate as a standalone device or may be connected to other computer systems or peripheral devices, such as by a network.

In a networked deployment, the information handling system 1200 may operate in the capacity of a server or as a client user computer in a server-client user network environment, or as a peer computer system in a peer-to-peer (or distributed) network environment. The information handling system 1200 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 1200 can be implemented using electronic devices that provide voice, video or data communication. Further, while a single information handling system 1200 is illustrated, the term "system" shall also be taken to include any collection of systems or sub-systems that individually or jointly execute a set, or multiple sets, of instructions to perform one or more computer functions.

The information handling system 1200 can include a disk drive unit and may include a computer-readable medium, not shown in FIG. 12, in which one or more sets of instructions, such as software, can be embedded. Further, the instructions may embody one or more of the methods or logic as described herein. In a particular embodiment, the instructions may reside completely, or at least partially, within system memory 1204 or another memory included at system 1200, and/or within the processor 1202 during execution by the information handling system 1200. The system memory 1204 and the processor 1202 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A bezel for an information handling system, the bezel comprising:
   a main frame to connect with a mounting bracket of the information handling system, the main frame to cover external ports and cables extending from an air inlet surface of the information handling system;
   a mounting insert located within the main frame, the mounting insert to snap fit with the mounting tabs of the mounting bracket, wherein the mounting insert being snap fitted to the mounting bracket secures the bezel to the information handling system; and
   a filter to snap fit within the mounting insert of the main frame, wherein the filter provides air filtration to an airflow prior to the airflow being pulled into the information handling system.

2. The bezel of claim 1, wherein a physical communication between the bezel and the information handling system prevents airflow from leaving an area between the main frame and the air inlet surface.

3. The bezel of claim 1, further comprising:
   a notch to enable a plurality of status indicator light emitting diodes to be viewable while the bezel is connected to the information handling system.

4. The bezel of claim 1, further comprising:
   a branding badge attached to the main frame, the branding badge to identify a company associated with the bezel and the information handling system.

5. The bezel of claim 1, wherein the filter is connected to the main frame via a toolless connection.

6. An information handling system comprising:
   a server including:
      a plurality of external ports, wherein each of a plurality of cables are connected to a different one of the external ports, wherein the external ports are located within an air inlet surface of the server; and
      a mounting bracket including a cable router and a plurality of mounting tabs, wherein the mounting bracket extends from the air inlet surface; and
   a bezel including:
      a main frame to connect with the mounting bracket, the main frame to cover the external ports and the cables, wherein the cables extend through the cable router of the mounting bracket to exit an area between the main frame and the air inlet surface;
      a mounting insert located within the main frame, the mounting insert to snap fit with the mounting tabs of the mounting bracket, wherein the mounting insert being snap fitted to the mounting bracket secures the bezel to the information handling system; and
      a filter to snap fit within the mounting insert of the main frame, wherein the filter provides air filtration to an airflow prior to the airflow being pulled into the server.

7. The information handling system of claim 6, wherein the cable router includes brushes to enable the cables to extend through the cable router and to prevent airflow from leaving the area between the main frame and the air inlet surface via the cable router.

8. The information handling system of claim 6, wherein the cable router further includes a slot to enable the cables to slide into the cable router from an end of the mounting bracket.

9. The information handling system of claim 6, wherein the bezel further includes a notch to enable a plurality of status indicator light emitting diodes to be viewable while the bezel is connected to the server.

10. The information handling system of claim 6, wherein the air inlet surface of the server faces a cold aisle of a server system.

11. The information handling system of claim 6, wherein the bezel further includes a branding badge attached to the main frame, the branding badge to identify a company associated with the bezel and the server.

12. An information handling system comprising:
   a server including:
      a plurality of external ports, wherein each of a plurality of cables are connected to a different one of the external ports, the external ports disposed within an air inlet surface of the server; and
a mounting bracket including a cable router and a plurality of mounting tabs, the mounting bracket extending from the air inlet surface; and
a bezel including:
   a main frame connected with to mounting bracket and covering the external ports and the cables, wherein the cables extend through the cable router of the mounting bracket to exit an area between the main frame and the air inlet surface, wherein the cable router includes brushes to enable the cables to extend through the cable router and to prevent airflow from leaving the area between the main frame and the air inlet surface via the cable router;
   a mounting insert located within the main frame, the mounting insert to snap fit with the mounting tabs of the mounting bracket, wherein the mounting insert being snap fitted to the mounting bracket secures the bezel to the information handling system;
   a filter snap fit within the mounting insert of the main frame and providing air filtration to an airflow prior to the airflow being pulled into the server; and
   a notch to enable a plurality of status indicator light emitting diodes to be viewable while the bezel is connected to the server.

13. The information handling system of claim 12, wherein the cable router further includes a slot to enable the cables to slide into the cable router from an end of the mounting bracket.

14. The information handling system of claim 12, wherein the air inlet surface of the server faces a cold aisle of a server system.

15. The information handling system of claim 12, wherein the bezel further includes a branding badge attached to the main frame, the branding badge to identify a company associated with the bezel and the server.

* * * * *